United States Patent [19]

Doi et al.

[11] Patent Number: 4,644,546
[45] Date of Patent: Feb. 17, 1987

[54] METHOD OF DIGITAL SIGNAL TRANSMISSION

[75] Inventors: Toshitada Doi, Kanagawa, Japan; Claudia Brandes, Ruemlang; Roger Lagadec, Zurich, both of Switzerland

[73] Assignees: Sony Corporation, Tokyo, Japan; Willi Studer AG, Regendsdorf, Switzerland

[21] Appl. No.: 642,688

[22] PCT Filed: Dec. 28, 1983

[86] PCT No.: PCT/JP83/00461
§ 371 Date: Aug. 14, 1984
§ 102(e) Date: Aug. 14, 1984

[87] PCT Pub. No.: WO84/02817
PCT Pub. Date: Jul. 19, 1984

[30] Foreign Application Priority Data
Dec. 30, 1982 [JP] Japan ................... 57-232899

[51] Int. Cl.⁴ ............................ H04Q 7/00
[52] U.S. Cl. ........................ 371/49; 371/55; 340/825.44
[58] Field of Search ............ 455/38; 340/825.44, 340/825.47; 371/55, 49, 56, 50, 40, 38; 375/114, 115, 116; 370/100, 105

[56] References Cited

U.S. PATENT DOCUMENTS

| | | | |
|---|---|---|---|
| 4,027,243 | 5/1977 | Stackhouse | 375/114 |
| 4,276,642 | 6/1981 | Siglow | 370/105 |
| 4,344,180 | 8/1982 | Cummiskey | 375/116 |
| 4,525,840 | 6/1985 | Heinz | 375/114 |
| 4,554,540 | 11/1985 | Mori | 371/55 |

*Primary Examiner*—Michael R. Fleming
*Attorney, Agent, or Firm*—Lewis H. Eslinger

[57] ABSTRACT

There is disclosed a method of digital signal transmission in which, for serially transmitting digital data of N channels, where N may for example be 16, 24 or 32, these data are serially and successively transmitted in groups of M, where M may for example be 2, 3 or 4, with each said group including data of K channels, where K may for example be 8, and in which a preamble with a pattern violating the rule of modulation for data transmission is provided, for example, at the foremost part of each such group, a data validity evaluation bit is added to the data of each such channel, and parity data is also provided to the totality of bits of each such group. A group address may also be provided to each such group for indicating its group number within the M groups.

6 Claims, 10 Drawing Figures

METHOD OF DIGITAL SIGNAL TRANSMISSION

BACKGROUND OF THE INVENTION

1. Field of the Invention

This invention relates to a method of digital signal transmission and, more particularly, to such method suitable for serial transmission of PCM digital audio signals of a large number of channels, such as 8 to 32 channels.

2. Description of Related Art

In recent years, it is becoming an accepted practice to convert analog signals, such as audio or voice signals, into digital signals by, for example, pulse code modulation system (PCM system) and to transmit the resulting digital signals through a signal transmission medium or to record or reproduce them on or from a recording medium. In the digital audio signals, one word is a sequence of bits of digital audio sample data obtained by quantizing and encoding a sample of the original analog signal. In addition to these digital audio sample data, it may be occasionally necessary to transmit error protection data, user definable alphanumeric data, channel status data inclusive of various information as later described, or an information used to check for reliability of the sample data. In addition, it may become occasionally desirable to be able to transmit other data useful in future application or data inferior in quality but useful for auxiliary digital audio channels.

The method of serially transmitting these digital signals containing these various data is required to satisfy the following conditions.

First of all, the transmission waveform need be DC-free in order that transmission may take place with or without the intermediary of AC coupling, and also that the threshold values may be positively detected in the case of an electrical system. In addition, the transmission waveform need also be polarity-free in order that transmission signals may remain unaffected even when the cables of, for example, a twisted pair are interchanged one with the other, the apparatus being additionally simplified in structure. The mechanical aspect should also be easy and simple and, in case of application to a broadcasting station or studio, should be adaptable to transmission distance requirements.

According to this technology, the PCM digital audio signals of a few channels, such as 1 to 4 channels, may be transmitted serially with high reliability and efficiency.

When serially transmitting digital signals of a large number of, e.g. 8 to 32 channels, through an optical fiber or other high-speed transmission medium, in view of the increased bit rate, it is desirable to make use of digital modulation systems which reduce the bandwidth required of the transmission medium. Since optical signal transmission from one point to another takes place at an approximately constant power level, the merits or demerits of using DC-free or polarity-free waveforms are cancelled. In addition, in fast serial transmission of multichannel digital data, some of the aforementioned requirements may preferably or should be modified.

In view of the foregoing, it is a principal object of the present invention to provide a method suited for serial transmission of PCM digital audio signals of a large number of channels, such as 8 to 32 channels, on a high-speed transmission medium, such as optical fiber.

SUMMARY OF THE INVENTION

In view of the above object, the present invention provides a method of digital signal transmission in which, for serially transmitting digital data of N channels, where N may be 16, 24 or 32, these data are serially and successively transmitted in groups of M, where M may be 2, 3 or 4, with each said group including data of K channels, where K may be 8, and in which a preamble with a pattern violating the rule of modulation for data transmission is provided, for example, at the foremost part of each such group, a data validity check bit is added to the data of each such channel, and parity data is also added to the totality of bits of each such group.

According to another feature of the present invention, there is also provided to each such group a group address for indicating the group number of a particular group within the M groups.

BRIEF DESCRIPTION OF THE DRAWINGS

FIGS. 1 to 3 depict the prior-art method of transmission of few channels which is to be the basis of the present invention, wherein

FIGS. 4 and 5 show another prior art which is to be the basis of the present invention, wherein

FIGS. 6A, 6B, and 6C to 8 show the method of multichannel digital signal transmission which is to be an embodiment of the present invention, wherein

FIG. 7(A–G) show a preamble pattern; and

DESCRIPTION OF THE PREFERRED EMBODIMENT

Before explaining the method of digital signal transmission according to the present invention, the method of digital signal transmission according to the Japanese Patent Application No. 82-31526 which is to be the basis of the present invention, is firstly explained.

The feature of the prior-art method of digital signal transmission resides in that, when serially transmitting digital data signals, each block of which is composed of plural words each consisting of plural bits, the digital data is modulated by a digital modulation system such that there is realized a DC- and polarity-free electrical signal waveform, a preamble of a constant bit length is provided per each word, and in that, as such preamble, one of at least four kinds of patterns corresponding to said words is used, said patterns selectively indicating whether the data is valid or invalid and also whether it is word sync or block sync.

Figure 1:
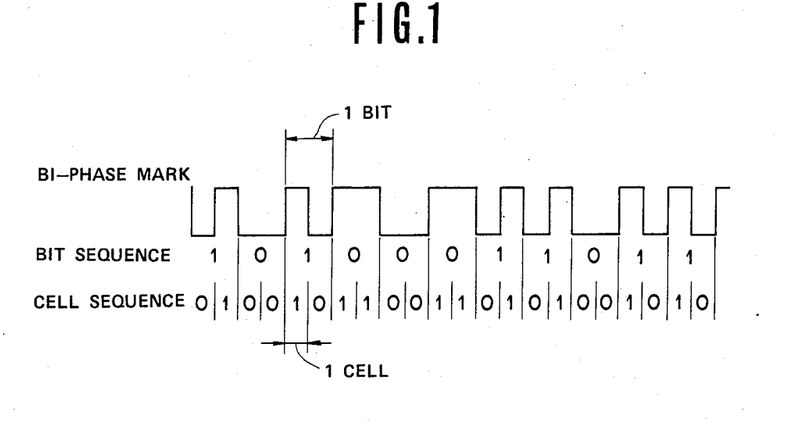
FIG. 1 shows an example of the biphase mark modulation system.

The biphase-mark system, as digital modulation system providing a DC- and polarity-free signal waveform, is also known as digital FM system, and may be represented by the signal waveform shown in FIG. 1 in connection with digital binary data. It is seen from FIG. 1 that each bit of data is represented by two binary cells. The first one of two cells corresponding to one data bit is always started with transition from "0" to "1" or from "1" to "0". When the data bit is "1", transition occurs between the first and the second cells. Otherwise (i.e.

when the data bit is "0") there is no such transition. Since the cell pair corresponding to a bit always starts with transition, bit sync can be detected and maintained easily. Furthermore, in the biphase mark system, the maximal distance between transitions corresponds to a length of two such cells. Hence, a distance longer than two cell length, for example, a distance indicating the distance of three cell length, violates the rule of the biphase mark, and thus may be used for the purpose of synchronization.

Figure 2:
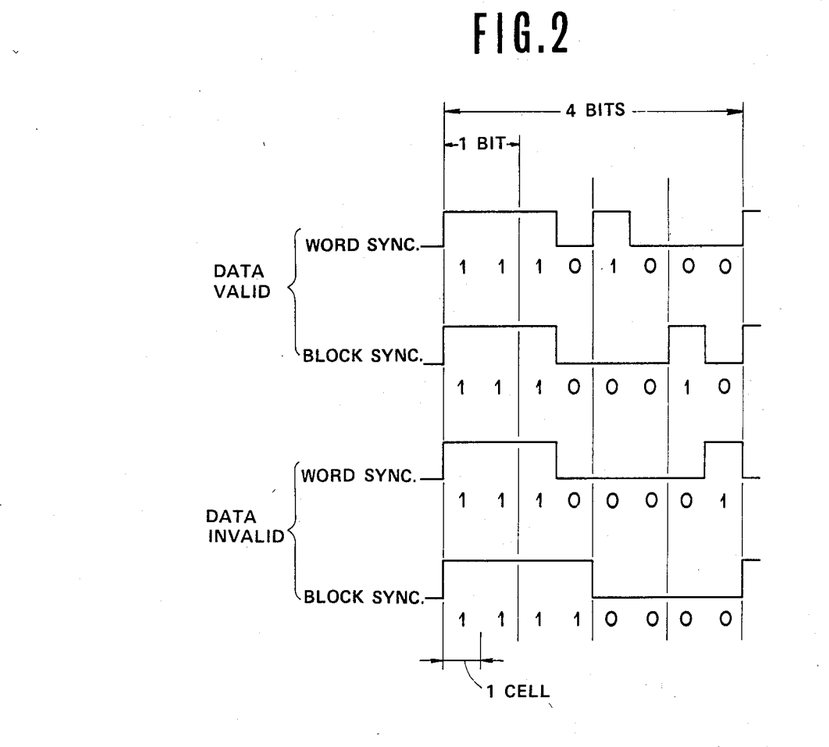
FIG. 2 shows a preamble pattern.

Supposing that the cell immediately preceding the preamble (the cell belonging to the biphase mark coded data) is "0", the aforementioned four kinds of the preamble are selected as shown by the following cell sequences, thus giving transmission waveforms of the pattern shown in FIG. 2.

| data valid, word sync: | 11 | 10 | 10 | 00 |
| data valid, block sync: | 11 | 10 | 00 | 10 |
| data invalid, word sync: | 11 | 10 | 00 | 01 |
| data invalid, block sync: | 11 | 11 | 00 | 00 |

When the cell immediately preceding the preamble is "1", the four preambles are represented as the reverse of the respective binary cells.

| data valid, word sync: | 00 | 01 | 01 | 11 |
| data valid, block sync: | 00 | 01 | 11 | 01 |
| data invalid, word sync: | 00 | 01 | 11 | 10 |
| data invalid, block sync: | 00 | 00 | 11 | 11 |

Word sync signals are extracted upon detection of any one of the above eight possible preambles. This makes it possible to design the digital circuit at low costs (with the use of a few gating circuits, ROMs or FPLA's). Block sync signals are extracted upon detection of a preamble indicating one of the above four possible block syncs. Data validity may be detected in the similar manner.

Next, the word format and the block format will be explained by referring to FIG. 3.

Figure 3:
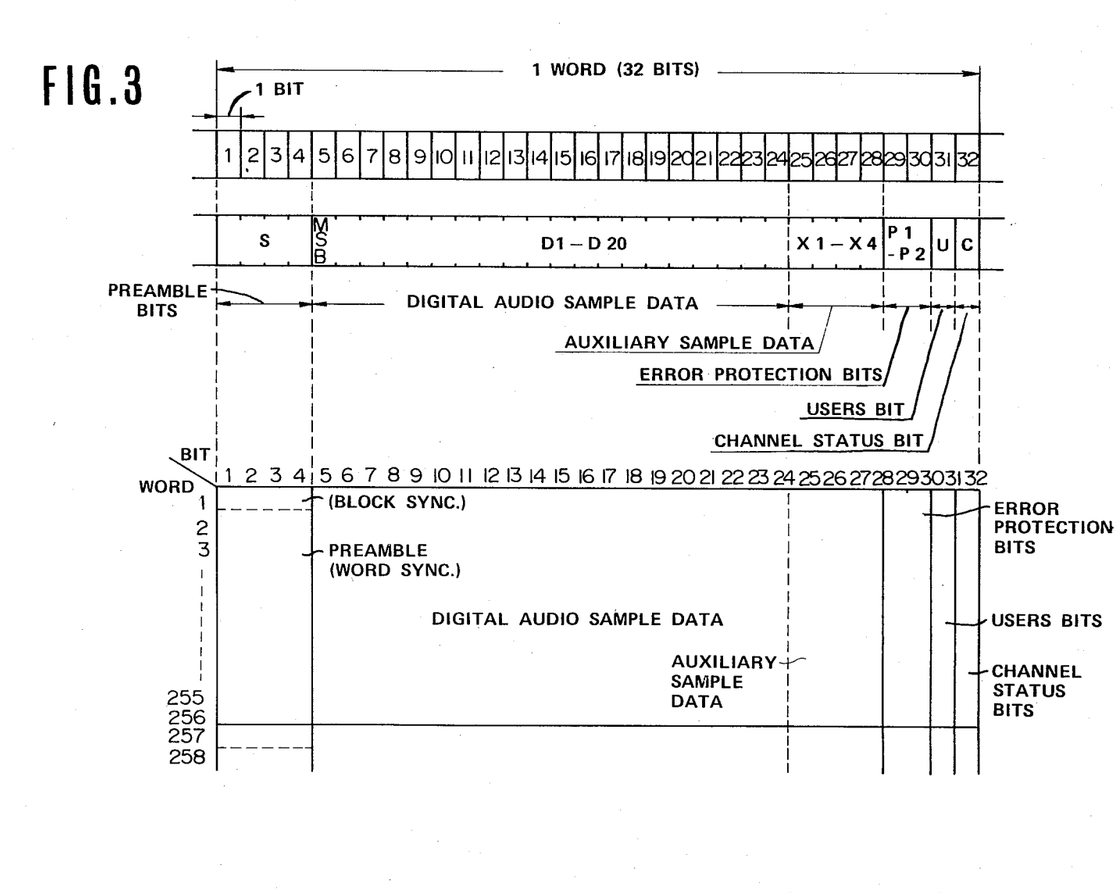
FIG. 3 shows a word and block format.

Referring to FIG. 3, one word is made up to 32 bits, with each word beginning with a preamble having a length of four bits. The preamble is followed by a digital audio sample data having the word length of 20 bits, or 24 bits in the case of addition of supplemental data. Because of the change in word length, the first bit of the sample data is MSB (most significant bit). This digital audio sample data is in two's complement configuration.

If necessary, the last four bits of the 24-bit sample data (called digital audio auxiliary sample data) is not used as least significant bit (LSB) of the sample data, but may be used e.g. as additional voice channel, bandwidth-limited digital audio channel to be added to the stereo digital audio channel, or as data channel for other data such as computer mixdown data.

The 4-bit digital audio auxiliary sample data are followed by another group of 4-bit spare data. Of these four bits, two may be used as error protection bits, one as user's bit and the remaining one as channel status bit, as later described. The 2-bit error protection data may occasionally be used for protection against digital audio sample data sequence burst error. The one user bit (user's bit) is used as alpha-numeric data channel that may be arbitrarily defined by the user. For example, eight channels with approximately 6K bits/second can be obtained.

In this manner, each word is composed of 32 bits, viz. four preamble bits, (20+4) digital audio sample data bits and 4 preliminary data bits, and encoded with the above 64 cells, in the manner described above.

Next, the channel status data is described.

The bit immediately preceding the preamble (viz. the last bit of each word) indicates the channel status. Thus the user can select several different statues (or can set a specific value unless designation is made). In addition, he can specify the manner in which the digital signal transmission system is used. This channel status data is transmitted in the format of one total word per block as shown for example in FIG. 3.

An information slowly changing with time is included in the channel status data. For example, when the 256 32-bit words inclusive of the sample data are made to correspond to one block, there is a sufficient allowance for the channel data, which data changes at intervals of 5 milliseconds. This is able to cover the totality of applications. When one block is made to correspond to 1024 sample data words, the status data can be obtained at intervals of 20 milliseconds, and can be applied only to limited field of application such as computer mixdown channel switching.

Next, concrete examples of the channel status data contents are explained.

One-word channel data appears once each block, thus once per 256 sample data words, in the example shown in FIG. 3. The foremost position of the channel status word is indicated by the aforementioned block sync signal. As shown in FIG. 3, since the last bit of the serially transmitted 32-bit word is the channel status data bit, the 32nd bit counted from the beginning of the preamble indicative of block sync is the first bit of the channel status word. One channel status data word has 256 bits and it is updated to a new word at intervals of approximately 5 milliseconds. In the channel status word, the following contents and bit sequences of the sub-words (channel status sub-words) may be taken into account.

| subword abbreviation | subword contents | subword length (bits) |
|---|---|---|
| — | not defined | 120 |
| EQ | equalizer information | 32 |
| RO | channel route: start point | 16 |
| RD | channel route: terminal point | 16 |
| CI | channel identification | 8 |
| SI | source machine identification | 8 |
| EP | digital audio sample error protection | 8 |
| XI | auxiliary sample usage identification | 8 |
| WL | digital audio sample word length | 4 |
| CM | channel muting information | 4 |
| EM | emphasis type | 4 |
| PS | digital audio sampling frequency | 4 |
| NC | number of channels and title of channel group | 8 |
| CR | CRC (error detecting | 16 |

| subword abbreviation | subword contents | subword length (bits) |
|---|---|---|
| | word) | |

In the aforementioned channel status sub-words, FS specifies the actual sampling frequency to be used in the digital audio channel. XI specifies to which one of the voice channel, digital audio channel of a narrow bandwidth and the mixdown information etc. the aforementioned digital audio auxiliary sample data bits are intended. EM specifies whether none or one of several emphasis types is selectively used as frequency response characteristics of the digital audio channel.

The foregoing is the digital interface for a small number of channels (one to four channels) proposed in our copending Japanese Patent Application No. 82-31526. A certain modification of the digital interface is also proposed.

Figure 4:
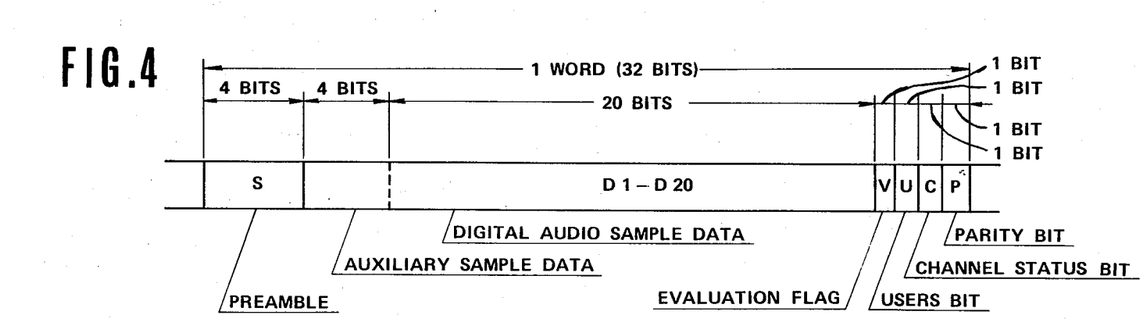
FIG. 5 shows a preamble patter and FIG. 4 shows a word format.

Thus, FIG. 4 shows an example of the word format of a modified digital interface with word contents substantially which is same as those described above except as to preamble pattern, addition of data valid evaluation bit and bit sequences.

Figure 5:
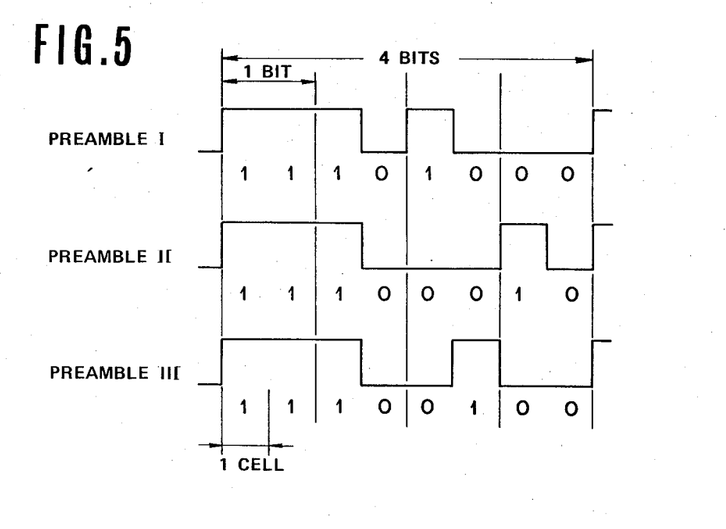

As to the preamble consisting of the first four bits of the 32-bit word shown in FIG. 4, the following three kinds of the cell sequences are selectively used for realizing the patterns as shown in FIG. 5.

| preamble I: | 11 | 10 | 10 | 00 |
|---|---|---|---|---|
| preamble II: | 11 | 10 | 00 | 10 |
| preamble III: | 11 | 10 | 01 | 00 |

Any information concerning the evaluation of data validity is not contained in these preambles I, II or III. In case of transmission of 1 to 4 channels A, B, C and D, the preambles I, II and III are indicative of word sync for channel A, word and block sync for channel B and word sync for channels B, C and D, respectively. Only the preambles I and II are caused to appear in the case of transmitting only one channel, whereas the preambles I, II and III are caused to appear in the case of transmitting more than two and up to four channels.

The preamble is followed by four bits of the aforementioned digital audio and auxiliary sample data, starting from LSB. These data are followed by 20 bits of the digital audio sample data starting from LSB. These data may also be 24-bit digital audio sample data, as described above. It should however be noted that, in this case, these data are arranged sequentially starting from LSB.

The remaining four bits of the 32-bit word are a data validity evaluation flag, user-definable data (user's data), channel status data and a parity bit, each being 1 bit. It is seen that the format corresponds to that shown in the preceding embodiment wherein, however, the two bits of the error protection data are reduced to one parity bit and the data validity evaluation bit is shifted from the preamble to the last four bits.

The digital signals of a smaller number of channels, such as one to four channels, transmitted by the above described transmission method, may be combined into the digital signals of a larger number of channels, such as 8 to 32 channels and serially transmitted by the method of the present invention. An embodiment of the transmitting method is hereafter explained in detail.

It should be noted that serial transmission of multichannel digital audio signals requires a transmission medium of extremely high data rate and broad bandwidth. One of technologically and economically reasonal solutions to this problem is to make use of the light transmission technology already implemented in telephony transmission line system. This has the advantage that one can make use of already available transmitters, receivers, signal processing circuits and optical fibers.

The hierarchy of digital telephony transmission circuit includes formats for transmission of approximately 1.5, 2, 8, 32 and 120 Mbit per second, while higher bit rates are also under inspection. In today's technology, 8 Mbits per second can be implemented with electrical communication cables, while 120 Mbits per second exceeds the needs of digital audio and also represents a more advanced technology. 32 Mbits per second, on the other hand, can be chosen as a basis for multichannel digital audio.

In transmitting the multichannel digital signals by a transmission technology with very fast rate, the following points of the requirements for a small number of channels can or must be modified.

In view of the very high bit rates involved, it may be justified to consider modulation codes which reduce the bandwidth required for transmission. In optical transmission, DC-free or polarity-free codes have no particular merits or demerits. While the above described digital signal transmission makes use of one code violation per word for synchronization, as at the preamble described above. It is however possible to design transmission with fewer violations, for example with one single violation at the beginning of one long block used for ordinary digital recording. In addition, multichannel transmission is frequently used in digital mixing apparatus and requires a large number of auxiliary talkback channels. It should be noted that, in order that the specifications defined for transmission of a small number of channels may be used without modifications, the audio data need be of the same word length, while the auxiliary data (parity, validity, channel status user definable data) need be of the same type.

The bandwidth required for multichannel digital audio signal transmission according to an embodiment of the present invention can be given by certain conditions.

These are the sampling frequency (set to be equal to 48 kHz) for the 1-channel audio signals; the number of channels (set to 16, 24 and 32); the number of bits per word (set to 32 bits); type of format used, viz. presence or absence of modulation; and types of modulation.

When the NRZ system is used without modulation and under the conditions specified in the above brackets, the necessary bit rates are:
24.576 Mbits per second for 16 channels;
36.864 Mbits per second for 24 channels; and
49.152 Mbits per second for 32 channels.

When modulation codes with limitation in run length (distance between signal transitions), viz. RLL codes, are used, an equivalent transmission rate lower than above will be required. Run-length codes which lower the bandwidth by approximately 33.3% are already known in the art. These RLL codes include 3PM used in magnetic disk recording, and HDM-1, used in digital audio recording. While 3PM is a very attractive, simple and powerful code for bandwidth reduction, its synchronization needs occur via rather long violence, because its maximal distance between transitions is equal to 6T, where T stands for a data bit period. In addition, 3PM requires a coding and decoding on the basis of groups of 3 bits, which makes synchronization more complex. HDM-1 has a maximal distance between transitions of 4.5T and can be coded and uncoded continuously so that it may be preferably employed in the transmitting method of the present invention.

When HDM-1 is used, the above figures for bandwidth (bit rates) becomes approximately
16.384 Mbauds for 16 channels;
24.576 Mbauds for 24 channels; and
32.768 Mbauds for 32 channels.

The expression "approximately" means that savings very close to, but not quite equal to, one third can be achieved in practice. Thus, transmission systems with a very few percent larger bit rates than specified above may be employed.

The result is that using an RLL modulation code makes it possible to transmit up to 32 digital audio channels in a format compatible with that of the digital audio interface and over a conventional 32 Mbits per second optical channel.

Figures 6A, 6B, 6C:
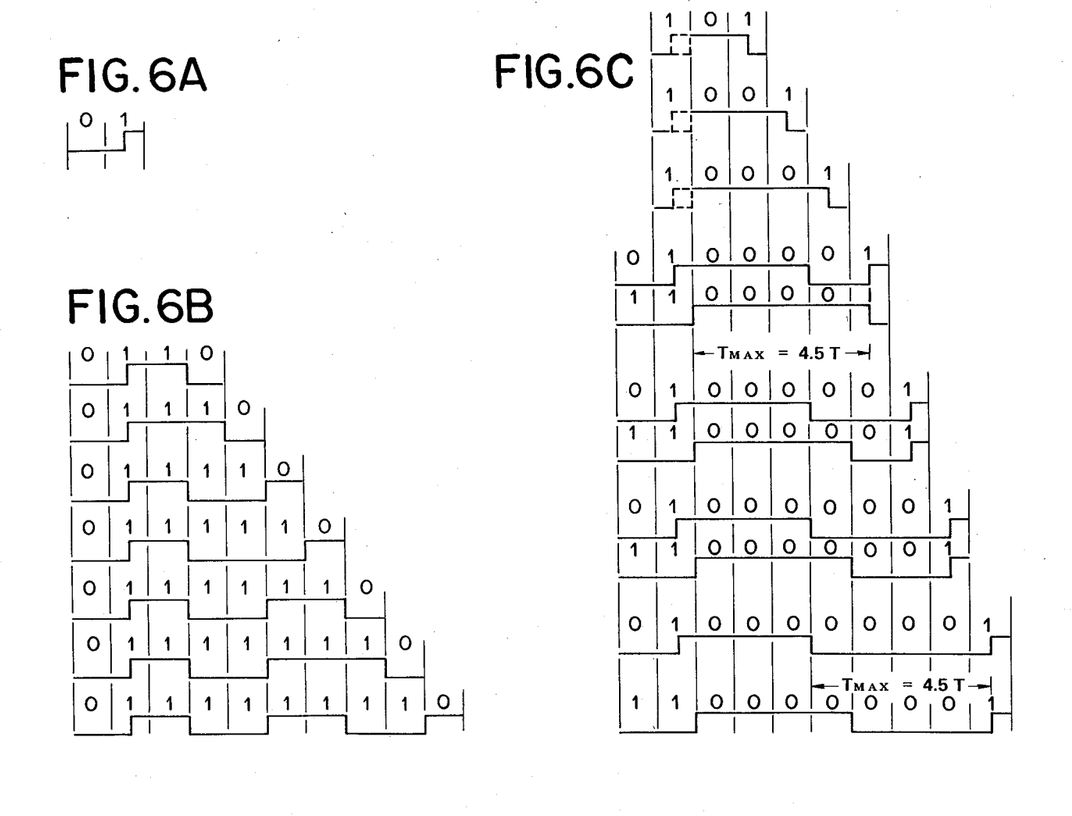
FIGS. 6A–6C show the HDM-1 modulation system adopted in the present embodiment.

The aforementioned HDM-1 modulation system, where HDM stands for high density modulation, has been proposed in our copending Japanese Patent Application No. 79-172532 (Japanese Provisional Patent Publication No. 81-94510). The code rule of this modulation system is now explained briefly by referring to FIG. 6.

As basic principle of HDM-1, when the data bits appear in the order of "0" and "1", transition occurs at the center of the data bit "1", as shown in FIG. 6A. When two or more "1"s appear in succession, transition occurs at the data bit boundary for two "1"s. Should three "1"s be left immediately before "0", transition between second and third bits is omitted and transition occurs at the boundary between "1" and "0" (FIG. 6B). When one or more "0"s appear in succession, should transition immediately before the first "0" be at the data bit boundary, and more than five "0"s occur in succession, the next transition occurs at the boundary between the fourth "0" and fifth "0" and, should transition immediately before the first "0" be at the center of the data bit, and more than four "0"s occur in succession, the next transition occurs at the boundary between the third and fourth "0"s (FIG. 6C).

Thus, as seen from FIG. 6, the minimal distance between transitions in HDM-1 is 1.5T (where T is a data bit period) as in 3PM. However, the maximal distance between transitions in the HDM-1 system is 4.5T, which is improved over 6T for 3PM system. In addition, modulators or demodulators used in the HDM-1 system may be simpler in structure than those used in 3PM.

The minimal distance of a preamble violating the coding principle for HDM-1 exceeds the maximal distance between transitions of 4.5T which accords with the HDM-1 rule. If a large jitter component is tolerable, and the cell/bit position is determined outside the preamble, such minimal distance is 5-bit length. In a much more advantageous case where the preamble indicates exactly the cell/bit position, the minimal distance is 6 bit length, which is in excess of the sync length of 4 bits used in the digital interface.

In the aforementioned digital interface for few channels, one code-violating preamble is used for each individual word. In the multichannel transmission of the present invention, a preamble is used for a much longer string of data. For compatibility with numbers of channels of 16, 24 and 32, a group of 8 channels is used as a basic unit, its transmission being initiated by a preamble. This is sufficiently tolerable in practice in view of the good signal to noise ratios to be expected in optical transmission over moderate distances of several hundred meters.

The preamble of 6 bit length (12 binary cells) violating the rule of HDM-1 is defined as follows.

Figure 7:
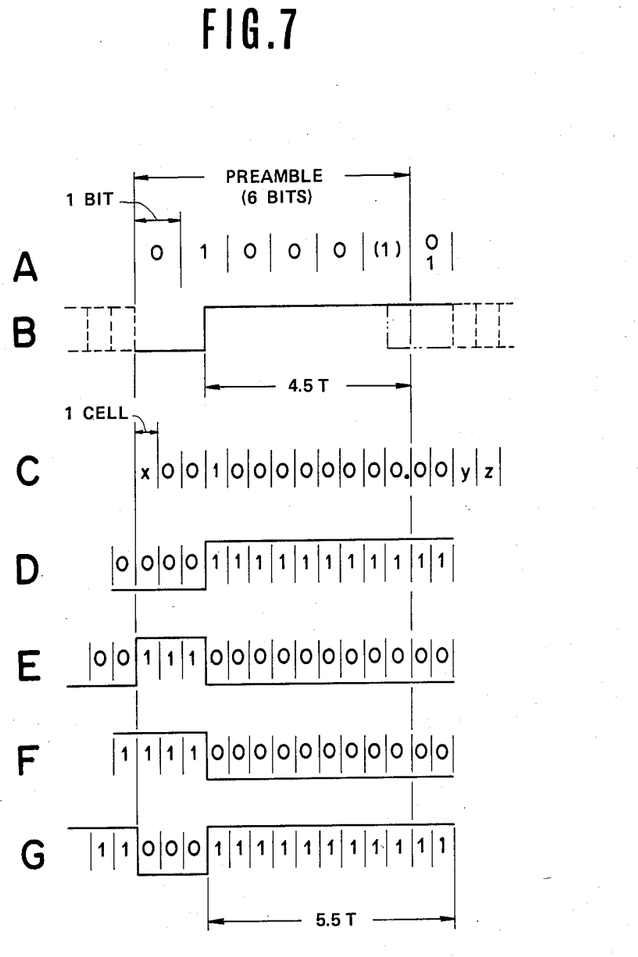

The beginning of the preamble corresponds to the HDM-1 encoding of the two bits "01". This enforces a transition between the third and fourth cells (or at the center of the second data bits). As the maximal distance between transitions in HDM-1 is 4.5T, i.e. 9 cells, and the preamble length need be an integer number of bits (i.e. an even number of cells), the preamble requires a minimum of 7 bits, or 14 cells. However, with a 6-bit preamble data "010001" as shown in FIG. 7A, by inhibiting transition at the last bit "1", the state of no transition may be maintained in the one bit immediately following the preamble, regardless of data contents. Thus, as shown in FIG. 7B, should there be a transition-free domain of 4.5T in the preamble portion, the result is that one may have a distance between transitions longer than 5.5T, including the one bit immediately following the preamble.

Thus, two cells (one bit) can be saved by restarting the HDM-1 encoder after the preamble with initial conditions corresponding to the two bits "01" at the two last bit positions of the preamble. This enforces that the two cells (one bit) immediately following the preamble are transition-free (no matter whether the bit contents are "1" or "0").

Thus, the preamble length can be reduced to 6 bits, and the preamble will display a minimal distance between transitions of 5.5T (11 cells). This distance is comprized of the cells of the preamble equal to 4.5T (9 cells) and a minimum of one T or two cells after it. In addition, there always is a transition immediately preceding the distance violation and positioned in the middle of a bit.

According to cell-unit-based NRZI indication, the transition pattern of the preamble and the succeeding portion is represented as follows.

| X0 | 01 | 00 | 00 | 00 | 00 | 00 | YX |
| --- | --- | --- | --- | --- | --- | --- | --- | where X, Y and Z are equal to 1 or 0 in dependence upon the presence or absence of the transition as determined by HDM-1 encoder data immediately before and after the preamble. In register with the actual transition pattern shown in FIG. 7B, the above NRZ1 pattern is indicated as a string of bits shown in FIG. 7C. The actual transition pattern is indicated as shown in FIGS. 7D to G in accordance with HDM-1 encoder data preceding the preamble. In FIGS. 7D to G, 1 or 0 represent the above described cell-unit-based NRZ pattern. It is noteworthy that embedding the preamble within a modulation code leads to the useful result that the synchronization pattern is longer than the preamble. The preamble has a length of 6 bits (12 cells), while the synchronization pattern has a length of 7 bits (14 cells).

Figure 8:
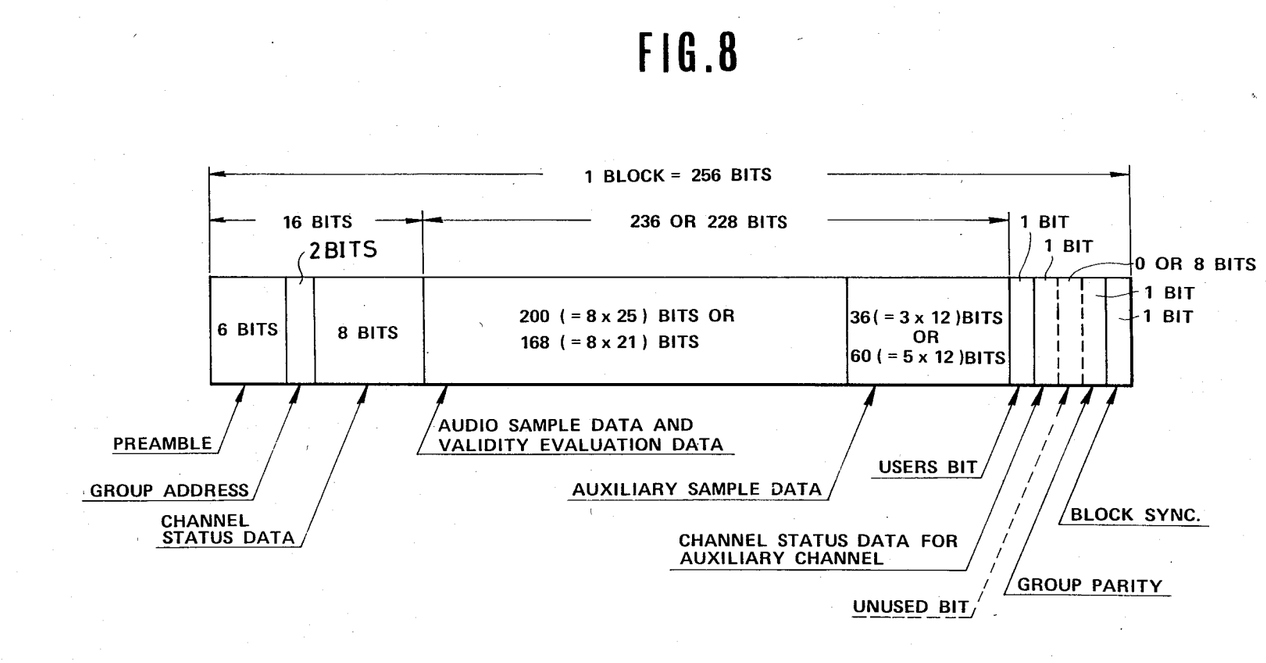
FIG. 8 shows a block format.

Next, the format of an 8-channel group is explaned by referring to FIG. 8. A group of eight channels is used as a basic unit, in order that interchangeability between the channel numbers of 16, 24 and 32 may be maintained more easily, as described hereinabove. More generally, multichannel transmission of KXM channels, where M stands for 1, 2, 3, - - - and K an integer may be realized rather easily.

Referring to FIG. 8, and 8-channel group is comprised of a total of 256 bits (=8×32 bits) and started with the above described 6-bit preamble indicating a group sync. The preamble is followed by a 2-bit frame sync or more precisely a group address within a frame. Thus the sync word can be thought of as an 8-bit word containing all sync information except block sync. Next comes the channel status data having as one word eight bits corresponding to the eight channels. The channel status data is followed by an audio data area composed of data validity evaluating bits and audio sample data, each for eight channels, these data or bits belonging to individual channels. The number of bits of the data area varies with the number of bits per word of the audio sample data. Thus it is 200 (=8×25) bits for 24 bits per word (25 bits with one evaluating bit); or $\frac{1}{8}$(=8×21) bits for 20 bits per word (or 21 bits with one evaluating bit). Next comes an auxiliary sample data composed of 36 bits for 200 bits of the audio sample and evaluation data area and 60 bits for 168 bits of the data area. Thus the sum of the number of bits of the audio sample and evaluation data area and that of the auxiliary sample data area is equal to 236 or 228 bits. Since one block has 256 bits, the number of the remaining bits is 4 or 12. Of these remaining bits, each one of four bits is allotted to user's data, channel status data for auxiliary channels, group parity data and block parity data. The remaining 0 or 8 bits are unused bits and arranged, for example, between the channel status data for auxiliary channels and the group parity data. Thus the contents of one group may be defined as follows:

preamble, 6 bits
group address, 2 bits
channel status of eight channels, 8 bits
audio sample and evaluation 200 or 168 bits
auxiliary sample, 36 or 60 bits users data, 1 bit
channel status, auxiliary channels, 1 bit
unused bits, 0 or 8 bits
group parity, 1 bit
block sync, 1 bit These components are modified according to HDM-1 system, except the preamble, which violates the HDM-1 modulating rule.

Next, the contents of these individual components are explained.

As mentioned hereinabove, the preamble has 6 bits but effectively realizes a sync pattern of 7 bits and the distance between transitions longer than 5.5T in violation of the HDM-1.

The audio sample and evaluation data area, the auxiliary sample data area and the succeeding data are in sharp contrast to the above described digital interface format for a small number of channels and, essentially in order to facilitate operations on the talkback channels (auxiliary channels), all data belonging to the individual channels (thus the aforementioned audio sample data and validity evaluation data for respectively eight channels ) are taken together to have these followed by all data belonging to the auxiliary (talkback channels), these data being then terminated by data belonging to the transmitted group as such, e.g. group parity data or block sync data.

Since the sampling frequency for 1-channel audio signals is 48 kHz, the data rate for user's data of one channel in the case of transmission of few channels is 48 k bits per second. The data rate is rather overdesigned as it makes it possible to transmit the contents of a 2000-page book in less than an hour. Thus, according to preferred embodiments of the invention, the channel capacity for user's data is reduced. Thus, by providing one bit for one group (eight channels), the user's data rate is reduced to 48 k/8=6 k (bits per second), which is practically sufficient. Assignment of the user's data bits to individual channels is achieved via block sync, and connection to the user's data channels is achieved via buffer.

It is adequate to retain the same data rate for channel status as in the single-channel interface. Thus, an 8-bit word carries the channel status information for the 8 channels in a group.

Next, it may be assumed that a word length of 12 bits is sufficient for the auxiliary or talkback channel. The auxiliary channels are three channels (3×12=36 bits) for a word length of the audio sample data equal to 24 bits, while it is set to 5 channels (5×12=60 bits) for the same word length equal to 20 bits.

The channel status information concerning these auxiliary channels is 1 bit for one group.

The group parity data is a simple parity data for the totality of 256 bits of one group.

The block sync data indicates block sync signals when a large number of, for example 192 or 256 groups, are taken together into one block.

Referring to a group address, group addresses "00", "01" are attached to two of the above described groups for providing a 16-channel frame. Similarly, by affixing group addresses "00", "01" and "10" to three groups or group addresses "00" to "11" to four groups, a 24-channel frame or a 32-channel frame can be provided respectively. Thus the group address indicates the number of a particular group in M groups when one frame is constructed by M groups.

The proposed format for multichannel digital audio signal transmission, is summarized as follows.

transmission format: serial, modulation code HDM-1
number of channels: 16, 24, 32
transmission rate: 1.024 Mbauds/channel (i.e. 16.384 Mbauds for 16 channels, 24.576 Mbauds for 24 channels and 32.768 Mbauds for 32 channels)
word length per transmitted word: 32
audio sample word length: 24 or 20
auxiliary audio sample word length: 12 (talkback)
number of auxiliary channels per group: 3 (audio with 24 bits word length), 5 (audio with 20 bits word length)
user definable data: 1 bit/group (0.125 bit/word)
channel status: 1 bit/channel
parity data: 1 bit/group
preamble (group sync) word length: 6 bits The preamble covers a group of 8 audio channels.

The numbers of auxiliary channels for the numbers of audio channels equal to 8, 16, 24 and 32 are shown in the Table below.

|  | 8 ch | 16 ch | 24 ch | 32 ch |
| --- | --- | --- | --- | --- |
| audio word length 24 bits | 3 | 6 | 9 | 12 |
| audio word length 20 | 5 | 10 | 15 | 20 |

| | 8 ch | 16 ch | 24 ch | 32 ch |
|---|---|---|---|---|
| bits | | | | |

According to the above described embodiments of the present invention, the bandwidth of the transmission medium can be reduced by using HDM-1 as modulation system, and a preamble violating the modulation system can be designed with a shorter word length. One group started with the preamble and consisting of eight channels is used as a basic unit for realizing a group structure so that it can be adapted to 16, 24 or 32 channels. Since the digital audio sample data or the auxiliary channel data are arranged with clear lines of demarcation intermediate the foremost and rearmost parts of one block, these data can be taken out easily and reliably from the block. Because of the provision of a large number of medium-quality talkback channels (auxiliary channels), the format is extremely versatile and can be applied to systems inclusive of digital mixing apparatus.

According to the method of transmitting digital signals of the present invention, when serially transmitting N-channel digital signals, where N represents 16, 24 or 32 as an example, K channels (such as eight channels) are taken together into one group, a preamble violating the modulation system is provided to the group and M such groups are transmitted alternately and successively, where M represents 2, 3 or 4 as an example. Thus the same format can be applied to any of 16-, 24- or 32-channel transmission systems. The preamble for each channel is dispensed with and parity data can be added on the group basis thus resulting in improved bit efficiency and talkback efficiency while making it possible to add many contents such as auxiliary channels for talkback. The data validity evaluation bit associated with each channel word is effective to prevent malfunction. Furthermore, in transmitting M groups of N channels, the group number of a particular group within the M groups can be identified easily with the aid of the group address.

We claim:

1. A method of digital signal transmission wherein N ($N=K\times M$) channels of digital data modulated by a digital modulating system having a predetermined rule for bit and cell level transitions are transmitted serially, where N, K and M are positive integers, the method comprising the steps of forming M groups each consisting of K channels, forming a preamble having a bit and cell pattern violating the rule of the modulating system, adding only one formed preamble to each said group, adding a data validity evaluation bit to the data of each channel of the group, adding parity data relating to the totality of the bits of one said group to said group, and repeatedly and successively transmitting said M groups of data.

2. The method of digital signal transmission as claimed in claim 1 comprising the further step of providing for each said group a group address for indicating its group number within the M groups.

3. The method of digital signal transmission as claimed in claim 1, in which said digital modulating system is chosen as high density modulation-1 (HDM-1) and said step of forming a preamble includes the steps of providing said preamble with six bits and having only one violation of the level transition rule in the provided 6-bit preamble.

4. The method of digital signal transmission as claimed in claim 3, including the further step of using said preamble as group synchronization information relative to said M groups.

5. The method of digital signal transmission as claimed in claim 3, further comprising the steps of adding group address bits between said preamble and said K channels of data in each of said M groups for providing frame synchronization information.

6. The method of digital signal transmission as claimed in claim 3, in which the maximum length between level transitions according to the rule is 5.5 bits and said step of forming said preamble includes arranging said violation therein so that the preamble displays a transition interval of 5.5 bits in length.

* * * * *